United States Patent [19]

Chandra et al.

[11] Patent Number: 5,789,325

[45] Date of Patent: Aug. 4, 1998

[54] COATING ELECTRONIC SUBSTRATES WITH SILICA DERIVED FROM POLYCARBOSILANE

[75] Inventors: Grish Chandra; Loren Andrew Haluska; Keith Winton Michael, all of Midland, Mich.

[73] Assignee: Dow Corning Corporation, Midland, Mich.

[21] Appl. No.: 638,707

[22] Filed: Apr. 29, 1996

[51] Int. Cl.$^6$ ........................... H01L 2/02
[52] U.S. Cl. ................ 438/781; 427/96; 428/446
[58] Field of Search ................ 438/781; 427/96; 428/446

[56] References Cited

U.S. PATENT DOCUMENTS

| | | |
|---|---|---|
| 4,749,631 | 6/1988 | Haluska et al. |
| 4,756,977 | 7/1988 | Haluska et al. |
| 5,387,480 | 2/1995 | Haluska et al. ................ 428/698 |
| 5,399,441 | 3/1995 | Bearinger et al. ................ 428/689 |
| 5,436,083 | 7/1995 | Haluska et al. ................ 428/688 |
| 5,458,912 | 10/1995 | Camilletti et al. ................ 427/126.4 |
| 5,470,802 | 11/1995 | Gnade . |
| 5,492,958 | 2/1996 | Haluska et al. ................ 524/439 |
| 5,516,596 | 5/1996 | Camilletti et al. ................ 428/698 |
| 5,563,102 | 10/1996 | Michael . |
| 5,602,060 | 2/1997 | Kobayashi . |
| 5,635,249 | 6/1997 | Haluska et al. ................ 427/387 |
| 5,693,701 | 12/1997 | Camilletti et al. ................ 524/417 |
| 5,711,987 | 1/1998 | Bearinger ................ 427/7 |

*Primary Examiner*—Gary Geist
*Assistant Examiner*—Jean F. Vollano
*Attorney, Agent, or Firm*—Sharon K. Severance; Roger E. Gobrogge

[57] ABSTRACT

A silica-containing coating is formed on an electronic substrate by applying a polycarbosilane on the substrate and converting it to a silica-containing material by heating in an oxidizing environment. The resultant thick planarizing coatings are useful as protective coatings and dielectric inner layers.

10 Claims, No Drawings

COATING ELECTRONIC SUBSTRATES WITH SILICA DERIVED FROM POLYCARBOSILANE

BACKGROUND OF THE INVENTION

The present invention relates to a novel method of applying silica-containing coatings on electronic substrates. The novelty herein resides in the fact that polycarbosilanes are used as the precursors.

Various methods for applying ceramic coatings on electronic devices are known in the art. For instance, it is known to use gaseous precursors in a variety of vapor deposition processes to produce coatings of silica, silicon nitride, silicon oxynitride, silicon carbide and the like. These coatings are taught to be useful as protective and dielectric layers.

Similarly, the use of polymeric precursors for depositing ceramic coatings on electronic devices is also known in the art. For instance, Haluska et al. in U.S. Pat. Nos. 4,749,631 and 4,756,977 and the Accuglass™ product literature disclose silica coatings produced by applying solutions of silica precursors to the devices and then heating the coated devices to convert the precursors to silica. These references, however, do not disclose the use of polycarbosilanes as the silica precursors.

The present inventors have now discovered that polycarbosilanes can be used to apply silica-containing coatings on electronic substrates. Since the resultant coatings are thick, planar and defect free, they can be used as protective and dielectric layers.

SUMMARY OF THE INVENTION

The present invention relates to a method for depositing a silica-containing coating on an electronic substrate. The method comprises first applying a coating comprising a polycarbosilane on an electronic substrate. The coated substrate is then heated in an oxidizing atmosphere at a temperature sufficient to convert the polycarbosilane into a silica-containing coating.

DETAILED DESCRIPTION OF THE INVENTION

The present invention is based on the discovery that preceramic polycarbosilanes can be used to form silica-containing coatings on electronic substrates. This was particularly unexpected since it was not known whether sufficient amounts of the carbon in the polymers could be removed without damaging the substrates and whether these coatings would have useful effects in the electronics industry.

As used in the present invention, the expression "silica-containing" refers to those pyrolyzed materials containing Si—O—Si bonds which may or may not be fully free of Si—C, Si—H, Si—OH and Si—OC (or nitrogen if a nitrogen-containing pyrolysis environment is used) but which are otherwise ceramic in character; the expression "planarizing coating" refers to a coating which is less irregular than the surface prior to application of the coating; and the expression "electronic substrate" includes, but is not limited to silicon based devices, gallium arsenide based devices, focal plane arrays, opto-electronic devices, photovoltaic cells, optical devices, flat panel displays, and integrated circuits at both wafer and assembly stage. Specific examples of such substrates include integrated circuits, transistor-like devices, capacitor and capacitor- like devices, multilayer devices, 3-D devices, silicon on insulator devices, super lattice devices and the like.

The process of the present invention involves applying a coating comprising a polycarbosilane on an electronic substrate and then heating the coated substrate in an oxidizing atmosphere at a temperature sufficient to convert the polycarbosilane into a silica-containing coating.

The polycarbosilanes useful in this invention are generally well known in the art and their structure is not particularly critical. Generally, such materials have backbones with alternating silicon and carbon atoms and may be either linear or highly crosslinked. As such, they may contain units of the type $[R_2SiCH_2]$ and/or $[R_3Si(CH_2)_{0.5}]$ where each R is independently selected from the group consisting of hydrogen, alkyl radicals containing 1 to 20 carbon atoms such as methyl, ethyl, propyl etc., aryl radicals such as phenyl, unsaturated hydrocarbon radicals such as vinyl and one of the above radicals which may be substituted with, for example, a silicon, a halogen, nitrogen or oxygen. Naturally, the polycarbosilanes useful in this invention may contain other units. Suitable polymers are described, for instance, by Yajima et al. in U.S. Pat. Nos. 4,052,430 and 4,100,233, both of which are incorporated herein in their entirety. Polycarbosilanes containing repeating (—SiHCH$_3$—CH$_2$—) units can be purchased commercially from the Nippon Carbon Co. Mixtures of polycarbosilanes may also be employed in the practice of this invention.

The polycarbosilanes of this invention can be prepared by techniques well known in the art. The actual method used to prepare the polycarbosilane is not critical. Suitable polycarbosilanes may be prepared by the methods of, for instance, by Yajima et al. in U.S. Pat. Nos. 4,052,430 and 4,100,233, both of which are incorporated herein in their entirety.

The polycarbosilane may also be substituted with various metal groups such as boron, aluminum, chromium and titanium. The method used to prepare such polymers is not critical. It may be, for example, the method of Yajima et al. in U.S. Pat. Nos. 4,248,814, 4,283,376 and 4,220,600.

Although only several polymers are described above, nearly any polycarbosilane may be used herein.

If desired, fillers can be added to the polycarbosilane to alter the properties of the coatings. For instance, a variety of metal or non-metal oxide, carbide, nitride or boride powder, particles or fibers can be added to change dielectric properties or to inhibit visualization or inspection.

The above polycarbosilane is first applied to the substrate to form a preceramic coating. Although any conventional technique may be used, it is particularly preferred to coat the substrate with a solution comprising a solvent and the polycarbosilane. Removal of the solvent by evaporation or a similar technique yields the preceramic coating. Other equivalent methods such as melt coating, however, are also contemplated herein.

If the above solution method is used, the polycarbosilane is first dissolved in a solvent. Various facilitating measures such as stirring and/or heating may be used to aid in the dissolution. Solvents which may be used include any which will dissolve the polycarbosilane to form a solution or suspension without affecting the coating. These solvents can include, for example, aromatic hydrocarbons such as xylene, benzene or toluene, alkanes such as n-heptane, decane or dodecane, ketones, esters, ethers, or cyclic dimethylpolysiloxanes, in an amount sufficient to dissolve the above materials. Generally, enough of the above solvent is used to form a 0.1–50 weight percent polycarbosilane solution.

If the above solution method is used, the coating solution is applied by techniques such as spin coating, dip coating, spray coating or flow coating. Evaporation of the solvent by any suitable means such as simple air drying by exposure to an ambient environment or by the application of a vacuum or mild heat (eg., <50° C.) yields the desired preceramic coating.

The resultant coating is then heated in an oxidizing environment which causes hydrolysis of the Si—C bonds and loss of carbon to thereby facilitate conversion of the polycarbosilane to a silica-containing material. In addition, other functional groups on silicon are removed by such an environment. Oxidizing environments such as those comprising air, $O_2$, ozone, moisture, oxygen plasma, ammonia, amines, nitrous oxide, etc. may be used. If desired, ultraviolet light may also be used in the process. Although the preferred environment will vary depending on the polycarbosilane, it is often preferred to heat under an oxidizing environment such as ozone to break the Si—C bonds and then under a dry ammonia atmosphere to effect removal of any remaining Si—OH groups and/or other functionality.

The polycarbosilane is subjected to the reactive environments at a temperature sufficient for ceramification. Generally, this temperature is about 20° to about 1000° C. depending on the reactive atmosphere. Preferred temperatures are in the range of about 50° to about 800° C. Higher temperatures usually result in quicker and more complete ceramification, but said temperatures may also have detrimental effects on various temperature sensitive substrates. For temperature sensitive substrates, temperatures in the range of about 100° to about 500° C. are often preferred. The polycarbosilane coatings are usually subjected to these temperatures for a time sufficient to ceramify the coating, generally up to about 6 hours, with a range of up to about 1–4 hours being preferred.

Any source of heat such as a hot plate, a convection oven, rapid thermal processing, or radiant or microwave energy can be used during the pyrolysis step.

By the above methods a silica-containing planarizing coating is produced on the substrate. The coating smooths the irregular surfaces of various substrates and has excellent adhesion. In addition, this coating can be quite thick (eg., >0.5 microns). This coating may also be covered by other coatings such as further $SiO_2$ coatings, $SiO_2$/modifying ceramic oxide layers, silicon containing coatings, silicon carbon containing coatings, silicon nitrogen containing coatings, silicon nitrogen carbon containing coatings and/or diamond like carbon coatings. Such multilayer coatings are taught in U.S. Pat. No. 4,973,526, which is incorporated herein by reference.

The following non-limiting Examples are provided so that one skilled in the art may more readily understand the invention.

EXAMPLE 1

Polycarbosilane purchased from Nippon Carbon Company, LTD., was diluted to 10 wt. % in toluene. The solution was filtered with a 0.2 micrometer filter. Several drops of this solution were applied to the surface of a 1 inch square silicon wafer and the wafer was spun at 3000 RPM for 10 seconds. The coated wafer was then heated at 400° C. for 2.5 hours in ammonia.

FTIR spectra were run before and after heating. A comparison of these spectra showed that the SiH had been removed by heating.

EXAMPLE 2

The same polymer solution used in Example 1 was spin coated on a Motorola 14011B CMOS device at 3000 RPM for 10 seconds. The coated device was then heated in the same manner as Example 1. The coated device tested good after coating and heating.

EXAMPLE 3

The same polymer solution used in Example 1 was flow coated on a 2.5×7.5 cm aluminum panel. The coated panel was then heated in the same manner as Example 1.

The coated panel was tested for resistance to 0.15 molar NaCl by immersing it in the solution at room temperature. After 1 week exposure, the portion of the panel coated with the ceramic was still bright and shiny. A portion of the panel which was not coated was found to be severely tarnished.

EXAMPLE 4

The same polymer solution used in Example 1 was spin coated on a hybrid circuit and a silicon wafer at 3100 RPM for 15 seconds. The coated circuit and wafer were then heated at 333° C. for 3.5 hours in ammonia with a UV light (a medium pressure mercury lamp—100w—Ace Hanovia lamp). FTIR spectra were run on the coated wafer before and after heating. A comparison of these spectra showed that the SiH had essentially been removed by heating.

EXAMPLE 5

The polycarbosilane polymer of Example 1 was diluted to 5 wt. % in heptane. This solution was spin coated on a 2.5 $cm^2$ silicon wafer at 3000 rpm for 20 seconds. The coated wafer was then heated at 175° C. in 4.3–4.4 wt. % ozone for 3 hours.

FTIR of the coating before and after heating showed that all of the organic substitution had disappeared and that the coating was converted to silica with some silanol (Si—OH) remaining.

The coated wafer was then heated for 3 hours at 175° C. in aqueous ammonia vapor. The resultant FTIR indicated that the silanol had been essentially removed. The coating thickness was 30 nanometers.

EXAMPLE 6

The polycarbosilane polymer of Example 1 was diluted to 22 wt. % in heptane. This solution was spin coated on a 2.5 $cm^2$ silicon wafer and a 2.5 $cm^2$ alumina substrate at 3000 rpm for 20 seconds. The coated wafer was then heated at 800° C. air for 1 hour.

FTIR of the coating before and after heating showed complete conversion of the coating to silica. The coating thickness was 430 nanometers and the RI was 1.432 (6328 lambda).

That which is claimed is:

1. A method for depositing a silica-containing coating on an electronic substrate comprising:
    (i) applying a coating composition comprising polycarbosilane and a filler, selected from the group consisting of metal oxides, metal carbides, metal nitrides, metal borides, non-metal oxides, non-metal carbides, non-metal nitrides and non-metal borides, on an electronic substrate and
    (ii) heating the coated substrate in an oxidizing atmosphere at a temperature sufficient to convert the polycarbosilane to a silica containing coating.

2. The method of claim 1 wherein the coating composition is formed by a method comprising dissolving the polycarbosilane and filler in a solvent to form a solution, coating the substrate with the solution and evaporating the solvent.

3. The method of claim 2 wherein the solvent is selected from the group consisting of aromatic hydrocarbons, alkanes, ketones, esters, glycol ethers, and cyclic dimethylpolysiloxanes and the solvent is present in an amount sufficient to dissolve the polycarbosilane to a 0.1–50 weight percent solution.

4. The method of claim 1 wherein the oxidizing atmosphere is selected from the group consisting of air, oxygen, ozone, water vapor, oxygen plasma, ammonia, amines, nitrous oxide and combinations thereof.

5. The method of claim 1 wherein the coated substrate is heated to a temperature between about 50° and about 800° C.

6. The method of claim 1 wherein the coated substrate is heated to a temperature in the range of about 50° to about 450° C. for a time of less than about 6 hours.

7. The method of claim 1 wherein the polycarbosilane contains units of the structure $[R_2SiCH_2]$, $[RSi(CH_2)_{1.5}]$ and/or $[R_3Si(CH_2)_{1/2}]$ wherein each R is independently selected from the group consisting of hydrogen, alkyl radicals containing 1 to 20 carbon atoms, alkyl radicals substituted with silicon, aryl radicals, and alkenyl radicals.

8. The method of claim 1 wherein the silica-containing coating is an inter-layer dielectric.

9. The method of claim 1 wherein the silica-containing coating protects the surface of the electronic substrate.

10. The method as claimed in claim 1 wherein the filler inhibits visual inspection of the electronic substrate.

* * * * *